US006774403B1

(12) United States Patent
Addicks

(10) Patent No.: US 6,774,403 B1
(45) Date of Patent: Aug. 10, 2004

(54) MULTI-COLORED LED LIGHTED SIGN

(76) Inventor: Lyle Addicks, 6006 Shull St., Bell Gardens, CA (US) 90201

(*) Notice: Subject to any disclaimer, the term of this patent is extended or adjusted under 35 U.S.C. 154(b) by 0 days.

(21) Appl. No.: 10/361,183

(22) Filed: Feb. 10, 2003

(51) Int. Cl.[7] .............................................. H01L 29/227

(52) U.S. Cl. ........................... 257/98; 257/99; 362/367; 362/362; 362/812

(58) Field of Search ..................... 257/99, 98; 362/570, 362/573, 362, 367, 375, 812; 313/510, 513

(56) References Cited

U.S. PATENT DOCUMENTS 4,259,800 A * 4/1981 Schoenfeld .................. 40/444
6,521,916 B2 * 2/2003 Roberts et al. ............. 257/100

* cited by examiner

*Primary Examiner*—Nathan J. Flynn
*Assistant Examiner*—Pershelle Greene
(74) *Attorney, Agent, or Firm*—Edgar W. Averill, Jr.

(57) ABSTRACT

A lighted sign having raised letters or other shapes. The letters are lighted from within and have more than one color visible from the outside of the letter. Each letter has a peripheral translucent wall of a first color and a translucent face plate of a second color. An LED holding frame is held within the peripheral wall and has LED's of the same color as the face plate held within the peripheral wall. At the back of the peripheral wall LEDs of a color the same as the peripheral side wall are held.

4 Claims, 1 Drawing Sheet

MULTI-COLORED LED LIGHTED SIGN

BACKGROUND OF THE INVENTION

Most lighted signs are either made from neon tubing or back lit translucent signs with fluorescent or incandescent lights behind the translucent sign. While neon lights have an almost indefinite life, such signs are not very bright and typically limited in the information they can convey, because of the necessity of bending the glass tubing into the shape of the desired letters. Fluorescent back lit signs can be made as bright as desired, but the fluorescent lights have a limited life and, especially for large signs, are very expensive to replace. Incandescent bulbs have even a shorter life than fluorescent bulbs and also give off more heat and use more electricity than fluorescent lights.

LEDs are replacing incandescent bulbs in many applications, such as traffic lights and vehicle brake lights. LEDs have the advantage of very low power consumption combined with very long life. Super bright white LEDs are expensive and, since a large number of LEDs is required to provide sufficient light, result in an initial cost which can be prohibitive for many signs.

BRIEF SUMMARY OF THE INVENTION

It is an object of the invention to provide a multi-colored LED lighted sign which is capable of producing letters having more than one color while still utilizing LEDs of a lower cost than super bright white LEDs.

The present invention is for a multi-colored LED lighted sign, having at least one peripheral translucent wall, fabricated from a translucent material having a first color. An inner LED holding frame has a back wall supporting a first plurality of LEDs emitting a second color. The back wall is formed outwardly to an outer flange, which is positioned over the outer peripheral edge of the peripheral translucent wall. An outer translucent face plate is fabricated from a translucent material having a second color different from the first color. The face plate is held against the outer flange of the LED holding frame. A second plurality of LEDs emitting a first color is supported by a support frame held at the inner peripheral edge of the translucent wall. Preferred colors include red and yellow LEDs, which are far less expensive than white LEDs.

DETAILED DESCRIPTION OF THE INVENTION

Figure 1:
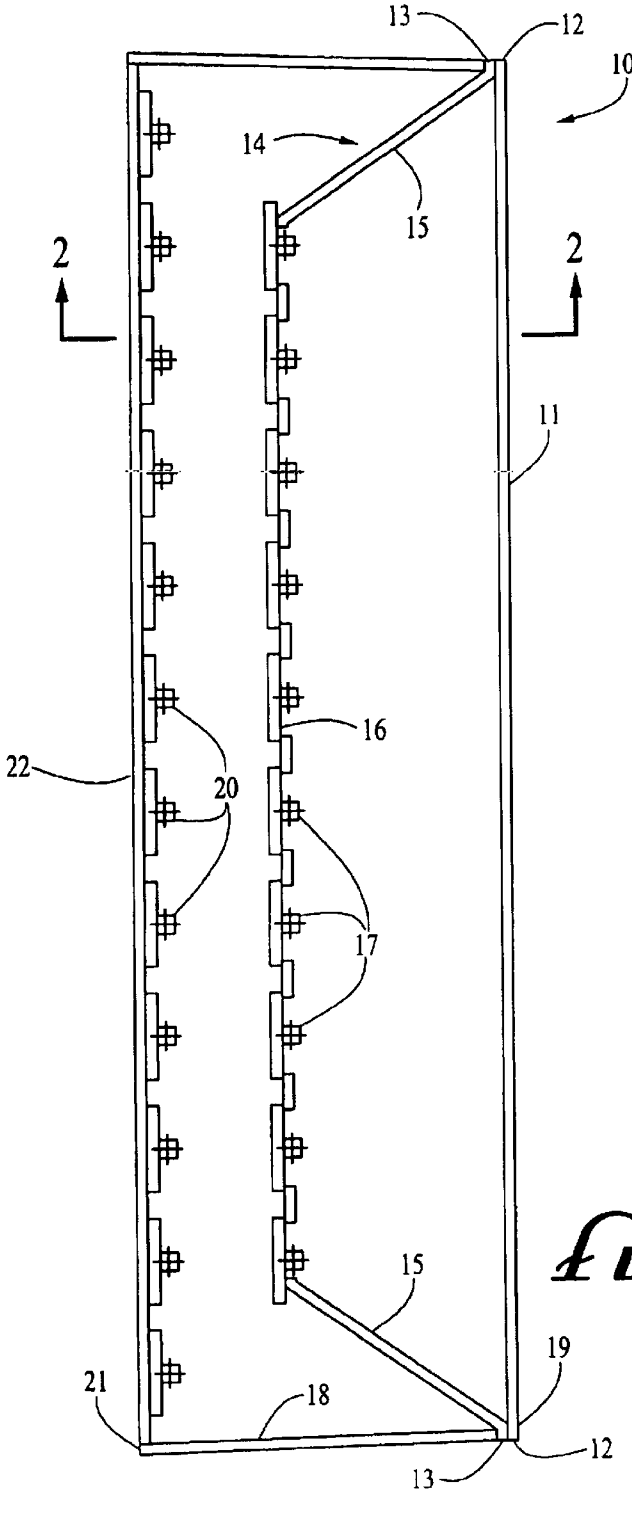
FIG. 1 is a cross-sectional side view of a multi-colored letter of the present invention.

A multi-colored lower case "L" letter is shown in cross-sectional view in FIG. 1 and indicated generally by reference character 10. While a simple letter "L" is shown, it is to be understood that the indicia of the present invention may be made in almost any shape to show, for instance, a company logo, a product, or an alpha numeric letter.

Letter 10 has an outer red face plate 11 which extends to an outer peripheral edge 12. Just inwardly from outer peripheral edge 12 is a flange 13 which is a part of an inner LED holding frame 14. Frame 14 has sidewalls 15 which for the letter "L" would be flat. It is clear that the shape of the frame, as well as the shape of the face plate and peripheral walls, are totally dependent upon the shape of the indicia intended to be shown. Frame 14 has a back wall 16 held against the back of sidewalls 15. Back wall 16 may either be an integral part of frame 14 or may be a separate member bolted or otherwise adhered to the back of frame 14. A plurality of LEDs 17 are held by back wall 16.

Frame 14 is secured to peripheral translucent wall 18 at its outer edge 19. Translucent sidewall 18 is of a different color than the outer face plate. For instance, with a red face plate, a yellow sidewall could be used. Because the sidewall and the face plate are separate pieces, the color line of demarcation is very sharp. The wall 18 is supported by a sidewall back 22, which holds a second set of LEDs and is held adjacent inner edge 21 of the wall 18. LEDs 20 are preferably a different color from LEDs 17. For instance, when LEDs 17 are red, light emitting LEDs 20 might be yellow light emitting. Red and yellow emitting diodes are substantially less expensive than white LEDs. Thus, when a yellow translucent sidewall 18 is used, the yellow light readily illuminates wall 18. Even if white LEDs were used, colors other than yellow would be filtered out by the yellow translucent wall 18.

Figure 2:
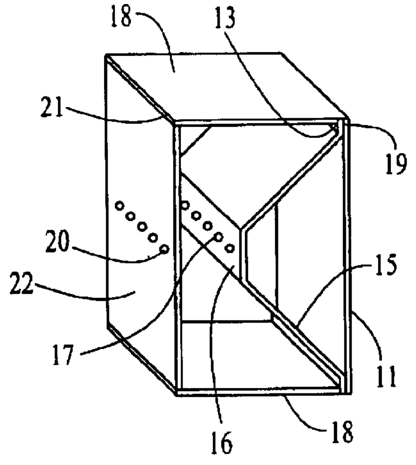
FIG. 2 is a perspective view taken along line 2—2 of FIG. 1.
Figure 3:
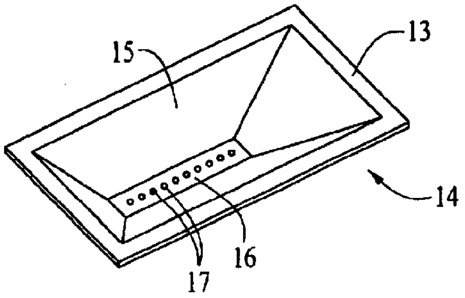
FIG. 3 is a perspective view showing the frame of the letter of FIG. 1.

A particular shape of frame is shown in FIGS. 2 and 3 of the drawings. Frame 18 has four flat angled sides 15 which are angled inwardly to back wall 16, which holds the plurality of LEDs. The outer flange 13, as shown in FIG. 1, is positioned between the outer translucent face plate 11 and the outer peripheral edge 19 of translucent wall 18. This flange provides a color break so that there is no blurriness between the face plate 11 and the sidewalls 18. The result is a multi-colored LED lighted sign which utilizes far less electricity than conventional signs and also, the LED life is far greater than fluorescent or incandescent bulbs.

The present embodiments of this invention are thus to be considered in all respects as illustrative and not restrictive; the scope of the invention being indicated by the appended claims rather than by the foregoing description. All changes which come within the meaning and range of equivalency of the claims are intended to be embraced therein.

I claim:

1. A multicolored LED lighted sign comprising:

at least one peripheral translucent wall fabricated from a translucent material having a first color, said peripheral translucent wall having an outer peripheral edge and an inner peripheral edge, said at least one peripheral translucent wall being visible from an exterior view of said sign;

an inner LED holding frame having a back wall supporting a first plurality of LEDs emitting a second color, an outwardly directed frame wall extending from said back wall and terminating at an outer flange positioned over the outer peripheral edge of said at least one peripheral translucent wall;

an outer translucent face plate fabricated from a translucent material having said second color which is a different color than said first color of said peripheral translucent wall and said outer translucent face plate having an outer periphery and being held against the outer flange of said inner LED holding frame outer flange at the outer periphery of said outer translucent face plate; and a second plurality of LEDs emitting said first color which is a different color than that emitted by said first plurality of LED supported by a support frame which is independent of said inner LED holding frame held at the inner peripheral edge of said at least one peripheral translucent wall and wherein said first plurality of LEDs illuminates said outer translucent face plate and said second plurality of LEDs illuminates said at least one peripheral wall.

2. The multicolored LED lighted sign of claim 1 wherein one of said first and second colors is red and the other of said first and second colors is yellow.

3. The multicolored LED lighted sign of claim 1 wherein said inner holding frame has four flat angled sides angled inwardly from said outer flange to said back wall and said back wall being smaller than said outer flange.

4. The multicolored LED lighted sign of claim 3 wherein said inner holding frame is yellow and said outer translucent face plate is red and said first color is yellow and the second color is red.

* * * * *